(12) United States Patent
Jang et al.

(10) Patent No.: US 9,165,983 B2
(45) Date of Patent: Oct. 20, 2015

(54) ORGANIC LIGHT EMITTING DIODE DISPLAY

(71) Applicant: SAMSUNG DISPLAY CO., LTD., Yongin, Gyeonggi-Do (KR)

(72) Inventors: Sang-Eok Jang, Yongin (KR); Sung-Soo Lee, Yongin (KR); Eun-Kyoung Nam, Yongin (KR); Se-Il Kim, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/169,368

(22) Filed: Jan. 31, 2014

(65) Prior Publication Data

US 2014/0312325 A1    Oct. 23, 2014

(30) Foreign Application Priority Data

Apr. 17, 2013    (KR) .................. 10-2013-0042364

(51) Int. Cl.
*H01L 29/72* (2006.01)
*H01L 27/32* (2006.01)
*H01L 51/52* (2006.01)

(52) U.S. Cl.
CPC .......... *H01L 27/322* (2013.01); *H01L 51/5253* (2013.01); *H01L 51/5262* (2013.01); *H01L 2251/558* (2013.01)

(58) Field of Classification Search
CPC .................................................... H01L 27/322
USPC ............................................................ 257/40
See application file for complete search history.

(56) References Cited

U.S. PATENT DOCUMENTS

| 8,227,978 B2 | 7/2012 | Lee et al. | |
| 2010/0001272 A1* | 1/2010 | Ye | 257/57 |
| 2010/0001301 A1* | 1/2010 | Karg et al. | 257/98 |
| 2014/0065750 A1* | 3/2014 | Mohan et al. | 438/35 |

FOREIGN PATENT DOCUMENTS

| KR | 10-2006-0020050 A | 3/2006 |
| KR | 10-2007-0085377 A | 8/2007 |
| KR | 10-2010-0041314 A | 4/2010 |

* cited by examiner

*Primary Examiner* — Edward Wojciechowicz
(74) *Attorney, Agent, or Firm* — Lee & Morse, P.C.

(57) ABSTRACT

An organic light emitting diode display includes a substrate including a plurality of subpixel areas, a plurality of pixel electrodes positioned corresponding to each of the plurality of subpixel areas on the substrate, a white emission layer formed on the plurality of pixel electrodes; a common electrode covering the white emission layer, a plurality of capping layers positioned corresponding to each of the plurality of subpixel areas on the common electrode, and a color filter layer including a plurality of filter layers corresponding to each of the plurality of subpixel areas. At least two capping layers among the plurality of capping layers have any one of a refractive index and a thickness different from each other.

6 Claims, 6 Drawing Sheets

ORGANIC LIGHT EMITTING DIODE DISPLAY

CROSS-REFERENCE TO RELATED APPLICATION

Korean Patent Application No. 10-2013-0042364, filed on Apr. 17, 2013, in the Korean Intellectual Property Office, and entitled: "Organic Light Emitting Diode Display," is incorporated by reference herein in its entirety.

BACKGROUND

1. Field

Example embodiments relate to an organic light emitting diode display, and more particularly, to an organic light emitting diode display including a white emission layer and a color filter layer.

2. Description of the Related Art

An organic light emitting diode display includes a plurality of pixels configured of red (R), green (G), and blue (B) subpixels. Each subpixel has an organic light emitting diode (OLED) and a pixel circuit positioned therein. The OLED includes two electrodes (anode and cathode) and an organic emission layer positioned therebetween. The pixel circuit includes at least two thin film transistors and at least one capacitor.

Normally, the organic emission layer is configured of red emission layer, green emission layer, and blue emission layer positioned in each of red subpixel, green subpixel, and blue subpixel. In this case, since the organic emission layer for each color should be deposited separately in the subpixel area having a very fine size, complex patterning technology is required.

In order to overcome this limitation, a structure in which the white emission layer is formed on all the subpixels and the color filter layer is positioned in an encapsulation substrate (hereinafter, for convenience, referred to as a white OLED) has been proposed. In this case, the fine patterning technology to separately form the organic emission layer for each color is not required, thereby making it possible to easily manufacture and implement high resolution.

The above information disclosed in this Background section is only for enhancement of understanding of the background of the invention and therefore it may contain information that does not form the prior art that is already known in this country to a person of ordinary skill in the art.

SUMMARY

An exemplary embodiment provides an organic light emitting diode display, including: a substrate including a plurality of subpixel areas; a plurality of pixel electrodes positioned corresponding to each of the plurality of subpixel areas on the substrate; a white emission layer formed on the plurality of pixel electrodes; a common electrode covering the white emission layer; a plurality of capping layers positioned corresponding to each of the plurality of subpixel areas on the common electrode; and a color filter layer including a plurality of filter layers corresponding to each of the plurality of subpixel areas. At least two capping layers among the plurality of capping layers have any one of a refractive index and a thickness different from each other.

The plurality of subpixel areas may include a red subpixel area, a green subpixel area, and a blue subpixel area and the capping layer may include a first capping layer corresponding to the red subpixel area, a second capping layer corresponding to the green subpixel area, and a third capping layer corresponding to the blue subpixel area.

At least two among the first capping layer, the second capping layer, and the third capping layer may have a refractive index different from one another. The first capping layer may have a refractive index of 2.7 to 3.6. The second capping layer and the third capping layer may have a refractive index of 2 to 3.

The first capping layer, the second capping layer, and the third capping layer may have a thickness different from one another. The first capping layer may have a thickness of 95 Å to 135 Å. The second capping layer may have a thickness of 50 Å to 90 Å. The third capping layer may have a thickness of 40 Å to 80 Å.

The first capping layer, the second capping layer, and the third capping layer may have the same refractive index.

The plurality of subpixel areas may include a white subpixel area with no capping layer positioned thereon.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Throughout the present specification, unless explicitly described to the contrary, "comprising" any components will be understood to imply the inclusion of other elements rather than the exclusion of any other elements. Further, throughout the present specification, it will be understood that when an element such as a layer, film, area, or substrate is referred to as being "on" or "over" another element, it can be "directly on" the other element or intervening elements may also be present. In addition, it means that the "on" or "over" is positioned above or below the target portion and it does not necessarily mean that is positioned upward in a gravity direction.

Figure 1:
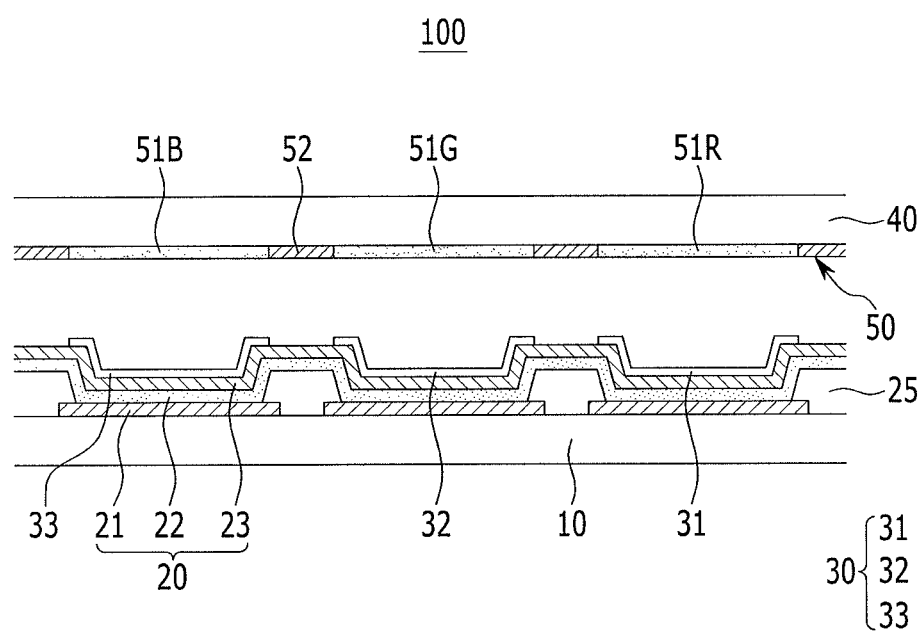
FIG. 1 illustrates a schematic cross-sectional view of an organic light emitting diode display according to a first exemplary embodiment.
Figure 2:
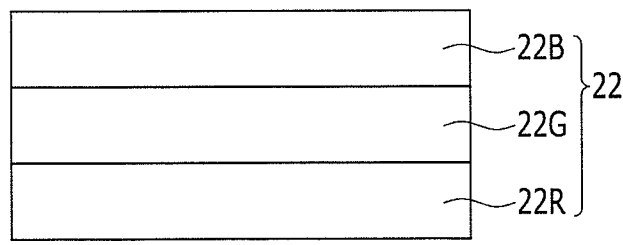
FIG. 2 illustrates an enlarged view of a white emission layer shown in FIG. 1.

FIG. 1 illustrates a schematic cross-sectional view of an organic light emitting diode display according to a first exemplary embodiment. FIG. 2 is an enlarged view of a white emission layer shown in FIG. 1.

Referring FIGS. 1 and 2, the organic light emitting diode display 100 of the first exemplary embodiment includes a substrate 10, a plurality of organic light emitting diodes (OLED) 20, a capping layer 30, an encapsulation substrate 40, and a color filter layer 50.

The substrate 10 may be made of glass, quartz, ceramic, a polymer film, a metal plate, and the like. The substrate 10 has a plurality of pixel areas thereon. Each pixel area may be divided into a red subpixel area, a green subpixel area, and a blue subpixel area. A pixel circuit (not shown) and an organic light emitting diode (OLED) 20 are positioned for each subpixel area.

The pixel circuit includes at least two thin film transistors (a switching thin film transistor and a driving thin film transistor) and at least one capacitor. The switching thin film transistor is used as a switching device for selecting a subpixel to emit light and the driving thin film transistor applies a driving power to a corresponding subpixel so that the subpixel which is selected emits the light.

FIG. 1 shows one of pixel area including three subpixel areas (for convenience, the pixel circuit will be omitted). Pixels having the same configuration are positioned in parallel with each other in a column direction and a row direction on the substrate 10, and the light emitted from the plurality of pixels is combined to implement an image.

The organic light emitting diode (OLED) 20 includes a pixel electrode 21, a white emission layer 22, and a common electrode 23. The pixel electrode 21 is separately formed for each subpixel area and is electrically connected to the driving thin film transistor of the corresponding subpixel area. The common electrode 23 is formed over the entire substrate 10.

A pixel defining film 25 having a lattice structure may be positioned between the pixel electrodes 21. The pixel defining film 25 forms an opening part that exposes each of the pixel electrodes 21 and divides the subpixel area. The pixel defining film 25 may be made of an organic film, e.g., a polyimide.

The white emission layers 22 are commonly formed on the pixel electrodes 21. At the time of depositing the white emission layer 22, an open mask having a single opening part corresponding to the entire display area on the substrate 10 may be used. In this case, there is no need for a fine patterning for each subpixel, such that a process is easily performed. The white emission layer 22 deposited on the pixel electrode 21 using the open mask is also formed on the pixel defining film 25.

The white emission layer 22 may be formed in a stacked structure where a red emission layer 22R, a green emission layer 22G, and a blue emission layer 22B are stacked (see FIG. 2). An order in which the red emission layer 22R, the green emission layer 22g, and the blue emission layer 22B are stacked is not limited to the example shown in FIG. 2 but may be variously changed. Alternatively, the white emission layer 22 may be made of single material layer that emits white light The pixel electrode 21 may be an anode electrode, i.e., a hole injection electrode, and the common electrode 23 may be a cathode electrode, i.e., an electron injection electrode, or vice versa. When the pixel electrode 21 is the anode electrode, at least one of a hole injection layer (HIL) and a hole transport layer (HTL) may be positioned between the pixel electrode 21 and the white emission layer 22. Further, at least one of an electron transport layer (ETL) and an electron injection layer (EIL) may be positioned between the white emission 22 and the common electrode 23.

The pixel electrode 21 that serves as the anode electrode may include at least one metal, for example, silver (Ag), nickel (Ni), molybdenum (Mo), gold (Au), platinum (Pt), tungsten (W), and copper (Cu) having a work function of 4.2 eV or more. The common electrode 23 that serves as the cathode electrode may include at least one of metal, for example, lithium (Li), magnesium (Mg), calcium (Ca), zinc (Zn), and aluminum (Al) having a work function lower than that of the pixel electrode 21, i.e., a work function of 4.2 eV or less.

The hole injected from the pixel electrode 21 and the electron injected from the common electrode 23 are coupled with each other in the white emission layer 22 to generate an exciton, and the white light is emitted when energy from the exciton is released.

The pixel electrode 21 may be formed of a reflective film and the common electrode 23 may be formed of a semipermeable film or a transparent conductive film. In this case, the light emitted from the white emission layer 22 is reflected by the pixel electrode 21 and transmitted by the common electrode 23, the color filter layer 50, and encapsulation substrate 40 to emit the light to the outside. The structure which emits light as described above is called an entire surface emission type and is mainly applied to a large-sized display.

The encapsulation substrate 40 may be integrally bonded to the substrate 10 by a sealant (not shown). The encapsulation substrate 40 seals the organic light emitting diode 20 from external environment containing moisture or oxygen, thereby suppressing deterioration of the organic light emitting diode 20 due to the moisture or oxygen. The encapsulation substrate 40 may be made of glass, polymer film, or the like. When both the substrate 10 and the encapsulation substrate 40 are made of the polymer film, the organic light emitting diode display 100 may be bendable.

The color filter layer 50 may be positioned on the encapsulation substrate 40 toward the substrate 10. The color filter layer 50 includes a red filter layer 51R positioned in the red subpixel area, a green filter layer 51G positioned in the green subpixel area, and a blue filter layer 51B positioned in the green subpixel area. The white light emitted from the white emission layer 22 is converted into red light in the red subpixel area, green light in the green subpixel area, and blue light in the blue subpixel area while passing through the color filter layer 50.

Each filter layer 51R, 51G, and 51B may have a black layer 52 positioned therebetween, thereby improving contrast of a screen. In addition, on the outer surface of the encapsulation substrate 40, an optical film (not shown) may be positioned in order to reduce light reflection by external light.

The capping layer 30 may be formed on the common electrode 23 and positioned in a path of the white light toward the color filter layer 50. The capping layer 30 may be formed of a monolayer or a multilayer structure including one of an organic matter, an inorganic matter, and a mixture thereof. The capping layer 30 has a refractive index higher than that of air.

The white light that passes through the capping layer 30 is incident on the common electrode 23 by being reflected at a boundary surface between the capping layer 30 and air layer positioned at upper portion thereof. Further, the white light is back reflected from the surface of the common electrode 23 to emit the light to the outside through the capping layer 30, which causes an interference phenomenon due to the difference of the path while emitting the light to the outside through the capping layer 30. Thus, the amount of light that is lost using total reflection is reduced, the amount of light that is transmitted is increased, and the luminous efficiency is increased.

The capping layer 30 may have a refractive index that is different with respect to at least two subpixels, thereby optimizing light extraction efficiency of the subpixels. The capping layer 30 may include a first capping layer 31 corresponding to the red subpixel area, a second capping layer 32 corresponding to the green subpixel area, and a third capping layer 33 corresponding to the blue subpixel area. At least two of the first capping layer 31, the second capping layer 32, and the third capping layer 33 have different refractive indexes.

Figure 3:
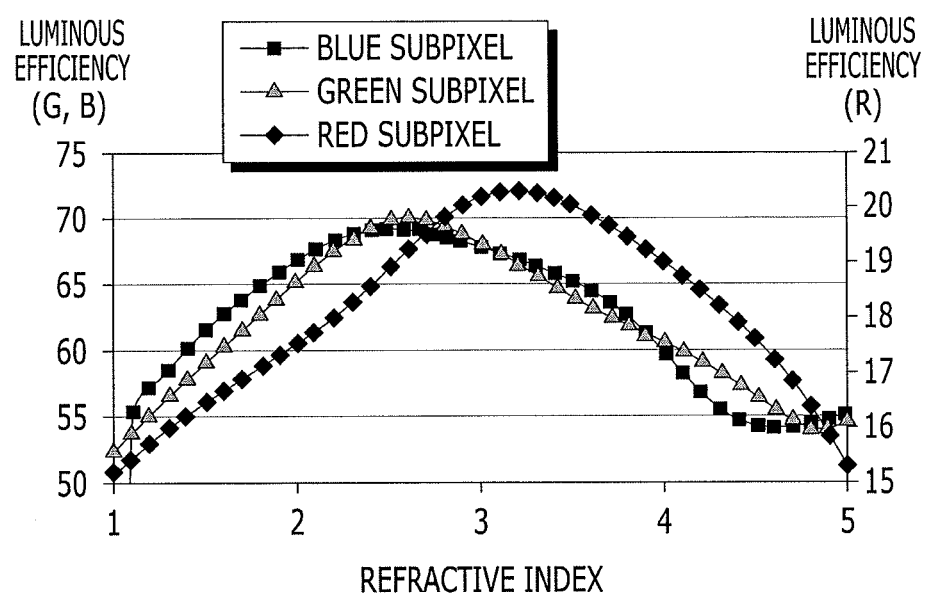
FIG. 3 illustrates a graph showing a simulation result of a luminous efficiency depending on a refractive index of a capping layer in the organic light emitting diode display shown in FIG. 1.

FIG. 3 illustrates a graph showing a simulation result of a luminous efficiency depending on a refractive index of a capping layer in the organic light emitting diode display shown in FIG. 1. In the graph of FIG. 3, a left vertical axis of the graph shows the luminous efficiency of the green and blue subpixels, and a right vertical axis thereof shows the luminous efficiency of the red subpixel.

Referring to FIGS. 1 and 3, the red subpixel shows the maximum luminous efficiency when the first capping layer 31 has a refractive index between 2.7 to 3.6. The green subpixel and the blue subpixel show maximum luminous efficiency when the second capping layer 32 and the third capping layer 33 have a refractive index of between 2 to 3.

The first capping layer 31, the second capping layer 32, and the third capping layer 33 may have the same thickness and may include at least one of organic matter, inorganic matter, an organometallic compound, and an oxide in which the above-mentioned refractive index range is satisfied. The capping layer 30 used in the simulation of FIG. 3 has a thickness of 700 Å.

The first capping 31 improves red light extraction efficiency among the white light, the second capping 32 improves green light extraction efficiency among the white light, and the third capping 33 improves blue light extraction efficiency among the white light during a process through which the white light emitted from the white emission layer 22 transmits the first capping layer 31, the second capping layer 32, and the third capping layer 33.

As a result, the organic light emitting diode display 100 according to the present exemplary embodiment optimizes the luminous efficiency of the red light, green light, and blue light that pass through the color filter layer 50, thereby improving image quality. In addition, the organic light emitting diode display 100 according to the present exemplary embodiment a degree of change of a color depending on an angle of view by the above-mentioned capping layer 30 may be reduced.

Figure 4:
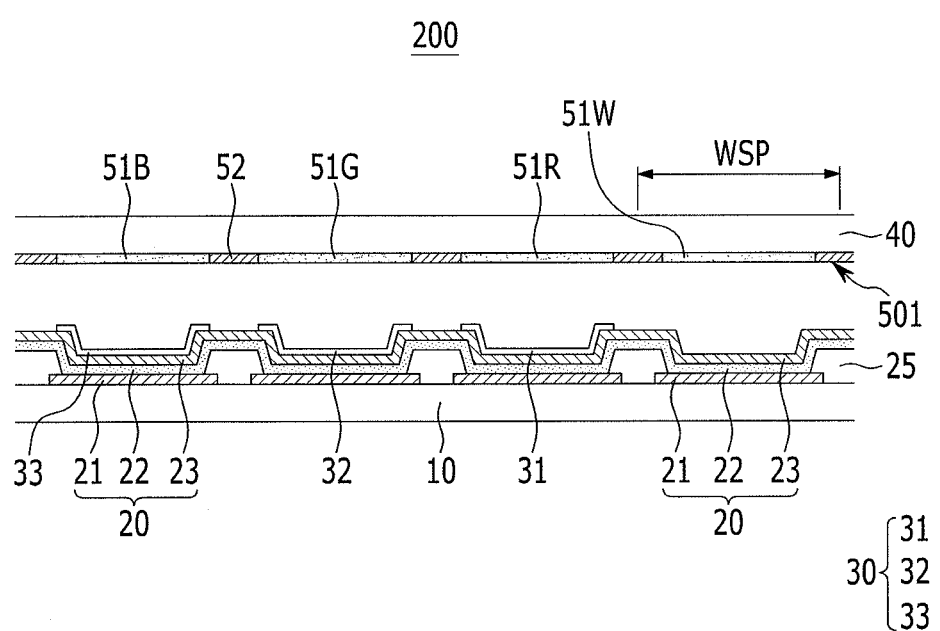
FIG. 4 illustrates a schematic cross-sectional view of an organic light emitting diode display according to a second exemplary embodiment.

FIG. 4 illustrates a schematic cross-sectional view of an organic light emitting diode display according to a second exemplary embodiment.

Referring to FIG. 4, the organic light emitting diode display 200 according to the second exemplary embodiment has the same configuration as the organic light emitting diode display of the above-mentioned first exemplary embodiment, except for a white subpixel area WSP added in each pixel area. The same reference numerals will be used with respect to the same components as the first exemplary embodiment, the different configuration therebetween will be described below.

An organic light emitting diode (OLED) 20 are positioned even in the white subpixel area WSP. The organic light emitting diode (OLED) 20 includes a pixel electrode 21, a white emission layer 22, and a common electrode 23. The capping layer 30 is not positioned in the white subpixel area and a transparent layer 51W is positioned in the white subpixel area WSP of the color filter layer 301. Thus, the white subpixel area WSP may be adjusted only by the amount of light, unlike the color subpixels.

The organic light emitting diode display 200 according to the second exemplary embodiment further includes the white subpixel, thereby improving color expression property and brightness.

Figure 5:
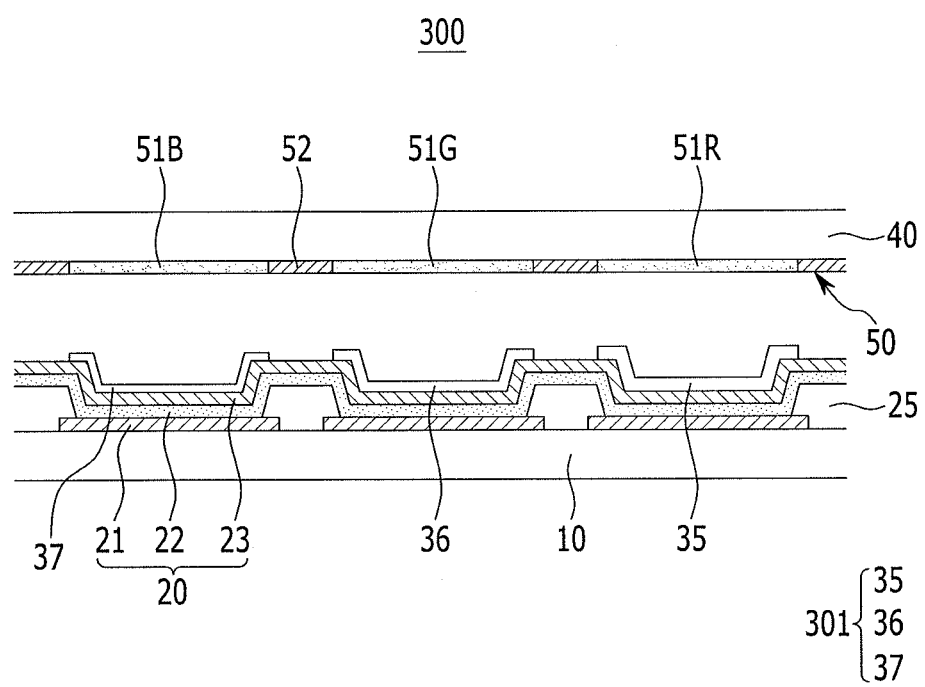
FIG. 5 illustrates a schematic cross-sectional view of an organic light emitting diode display according to a third exemplary embodiment.

FIG. 5 illustrates a schematic cross-sectional view of an organic light emitting diode display according to a third exemplary embodiment.

Referring to FIG. 5, the organic light emitting diode display 300 according to the third exemplary embodiment has the same configuration as the organic light emitting diode display of the above-mentioned first exemplary embodiment, except for a capping layer 301 having a different thickness for each pixel area. The same reference numerals will be used with respect to the same components as the first exemplary embodiment, the different configuration therebetween will be described below.

The capping layer 301 includes a first capping layer 35 corresponding to the red subpixel area, a second capping layer 36 corresponding to the green subpixel area, and a third capping layer 37 corresponding to the blue subpixel area. The first capping layer 35, the second capping layer 36, and the third capping layer 37 may all have different thicknesses.

Figure 6:
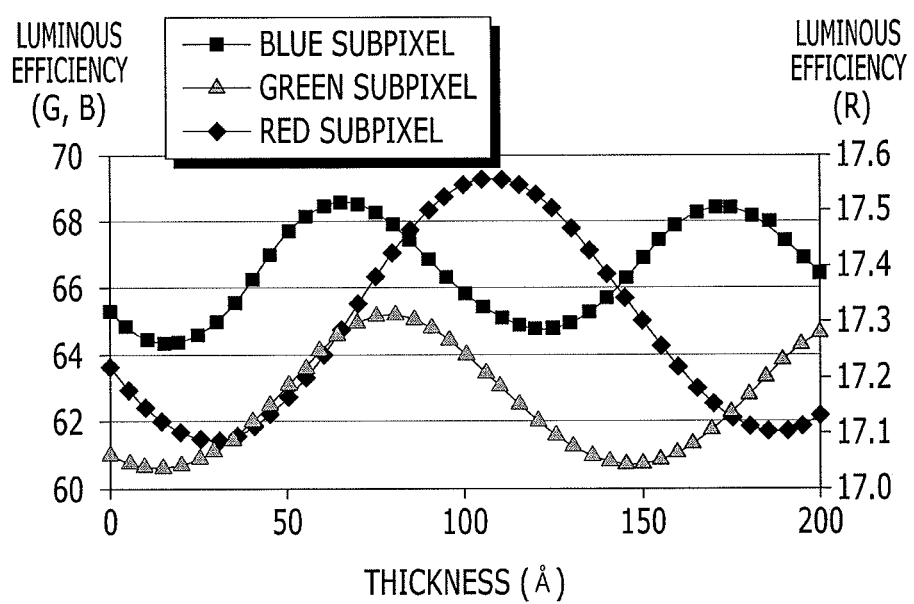
FIG. 6 illustrates a graph showing a simulation result of a luminous efficiency depending on a thickness of a capping layer in the organic light emitting diode display shown in FIG. 5.

FIG. 6 illustrates a graph showing a simulation result of a luminous efficiency depending on a thickness of a capping layer in the organic light emitting diode display shown in FIG. 5.

Referring to FIGS. 5 and 6, the red subpixel shows the maximum luminous efficiency when the first capping layer 35 has a thickness between 95 Å to 135 Å. The green subpixel shows the maximum luminous efficiency when the second capping layer 36 has a thickness between 50 Å to 90 Å. The blue subpixel shows the maximum luminous efficiency when the third capping layer 37 has a thickness between 40 Å to 80 Å.

The first capping layer 35, the second capping layer 36, and the third capping layer 37 may have the same refractive index and may include at least one of organic matter, inorganic matter, an organometallic compound, and an oxide. The capping layer 301 applied to the simulation of FIG. 6 has a refractive index of 1.9.

The first capping 35 improves red light extraction efficiency among the white light, the second capping 36 improves green light extraction efficiency among the white light, and the third capping 37 improves blue light extraction efficiency among the white light during a process through which the white light emitted from the white emission layer 22 transmits the first capping layer 35, the second capping layer 36, and the third capping layer 37.

In the first and third organic light emitting diode displays 100 and 300 according to the first and third exemplary embodiments, the first capping layers 31 and 35, the second capping layer 32 and 36, and the third capping layers 33 and 37 may be formed of deposition method, laser thermal transfer imaging method, or the like.

The deposition method uses a deposition mask having a plurality of openings corresponding to the subpixel areas with a specific color. The laser thermal transfer imaging method is prepared a base film, a donor film including light to heat conversion layer and a transfer layer and then a part of the light to heat conversion layer and a part of the transfer layer contacting thereto are expanded by irradiating a laser to the donor film, thereby transferring the transfer layer on the common electrode.

Figure 7:
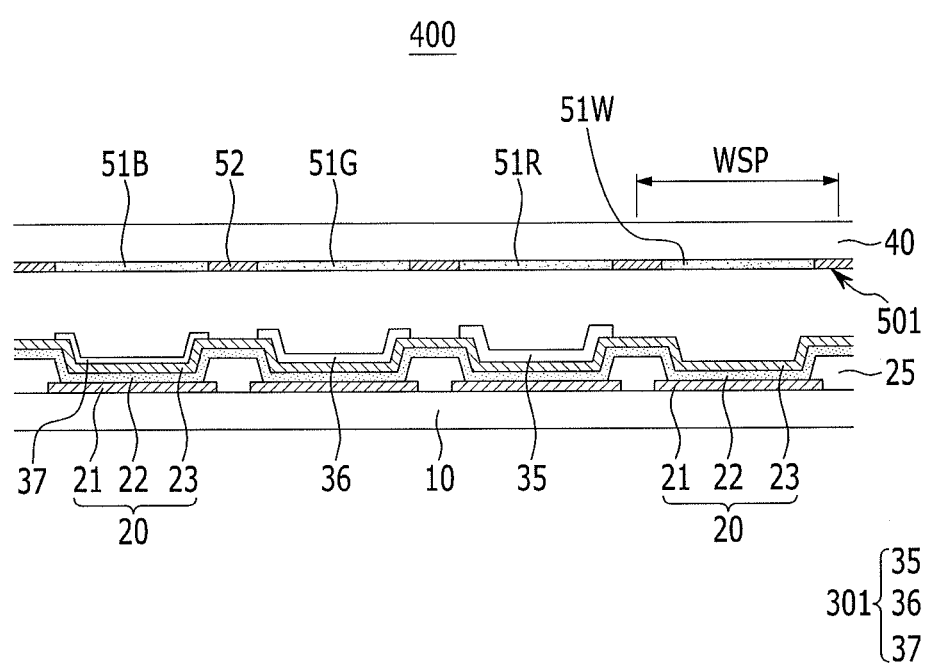
FIG. 7 illustrates a schematic cross-sectional view of an organic light emitting diode display according to a fourth exemplary embodiment.

FIG. 7 illustrates a schematic cross-sectional view of an organic light emitting diode display according to a fourth exemplary embodiment.

Referring to FIG. 7, the organic light emitting diode display 400 according to the fourth exemplary embodiment has the same configuration as the organic light emitting diode display of the above-mentioned third exemplary embodiment, except for a white subpixel area WSP added in each pixel area. The same reference numerals will be used with respect to the same components as the third exemplary embodiment, and the different configuration therebetween will be described below.

An organic light emitting diode (OLED) 20 are positioned even in the white subpixel area WSP. The organic light emitting diode (OLED) 20 includes the pixel electrode 21, the white emission layer 22, and the common electrode 23. The capping layer 301 is not positioned in the white subpixel area WSP and a transparent layer 51W may be positioned in the white subpixel area WSP of the color filter layer 501. Thus, the white subpixel may be adjusted only the amount of light unlike the color subpixels.

The organic light emitting diode display 400 according to the fourth exemplary embodiment further includes the white subpixel, thereby improving color expression property and brightness.

By way of summation and review, from an optical point of view, when separate organic emission layers are used for the different colors, the maximum constructive interference is generated at a specific thickness (a thickness implementing a ¼ wavelength of a desired wavelength) for each wavelength of R, G, and B light, thereby making it possible to increase a luminous efficiency using the constructive interference. However, in the case of the white OLED, since the organic emission layer has the same thickness in all the subpixels, the above-mentioned the maximum constructive interference effect cannot be used. In addition, in the white OLED, white light having a wider wavelength range is discharged, such that the degree of change of the color depending on the angle of view is relatively large.

In contrast, example embodiments provide an organic light emitting diode (OLED) display capable of increasing a luminous efficiency for each of red, green, and blue subpixels, and decreasing a degree of change of a color depending on an angle of view in the organic light emitting diode (OLED) display including to a white emission layer and a color filter layer.

The organic light emitting diode display may optimize the luminous efficiency of the red light, green light, and blue light that pass through the color filter layer, thereby improving image quality and reducing a degree of change of a color depending on an angle of view.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a substrate including a plurality of subpixel areas;
   a plurality of pixel electrodes positioned corresponding to each of the plurality of subpixel areas on the substrate;
   a white emission layer formed on the plurality of pixel electrodes;
   a common electrode covering the white emission layer;
   a plurality of capping layers positioned corresponding to each of the plurality of subpixel areas on the common electrode; and
   a color filter layer including a plurality of filter layers corresponding to each of the plurality of subpixel areas,
   wherein at least two capping layers among the plurality of capping layers have any one of a refractive index and a thickness different from each other,
   the plurality of subpixel areas includes a red subpixel area, a green subpixel area, and a blue subpixel area,
   the capping layer includes a first capping layer corresponding to the red subpixel area, a second capping layer corresponding to the green subpixel area, and a third capping layer corresponding to the blue subpixel area, and
   the plurality of subpixel areas further includes a white subpixel area with no capping layer thereon.

2. The organic light emitting diode display of claim 1, wherein at least two among the first capping layer, the second capping layer, and the third capping layer have a refractive index different from one another.

3. The organic light emitting diode display of claim 2, wherein:
   the first capping layer has a refractive index of 2.7 to 3.6, and
   the second capping layer and the third capping layer have a refractive index of 2 to 3.

4. The organic light emitting diode display of claim 1, wherein the first capping layer, the second capping layer, and the third capping layer all have different thicknesses.

5. The organic light emitting diode display of claim 4, wherein:
   the first capping layer has a thickness of 95 Å to 135 Å,
   the second capping layer has a thickness of 50 Å to 90 Å, and
   the third capping layer has a thickness of 40 Å to 80 Å.

6. The organic light emitting diode display of claim 5, wherein the first capping layer, the second capping layer, and the third capping layer have the same refractive index.

* * * * *